US 9,632,118 B2

(12) United States Patent
Yang et al.

(10) Patent No.: US 9,632,118 B2
(45) Date of Patent: Apr. 25, 2017

(54) CURRENT SENSING DEVICE AND METHOD USING CURRENT TRANSFORMER

(71) Applicant: Hyundai Motor Company, Seoul (KR)

(72) Inventors: Jin Myeong Yang, Busan (KR); Youn Sik Lee, Gyeonggi-Do (KR); Je Hwan Lee, Gyeonggi-Do (KR); Seong Min Lee, Gyeonggi-Do (KR); Sang Cheol Shin, Gyeonggi-Do (KR); Han Geun Jang, Gyeonggi-Do (KR)

(73) Assignee: Hyundai Motor Company, Seoul (KR)

( * ) Notice: Subject to any disclaimer, the term of this patent is extended or adjusted under 35 U.S.C. 154(b) by 162 days.

(21) Appl. No.: 14/632,246

(22) Filed: Feb. 26, 2015

(65) Prior Publication Data

US 2016/0116511 A1 Apr. 28, 2016

(30) Foreign Application Priority Data

Oct. 28, 2014 (KR) ........................ 10-2014-0147689

(51) Int. Cl.
*G01R 19/32* (2006.01)
*G01R 19/00* (2006.01)

(52) U.S. Cl.
CPC ......... *G01R 19/32* (2013.01); *G01R 19/0092* (2013.01)

(58) Field of Classification Search
CPC .... G01R 19/32; G01R 19/0092; G01R 15/18; G05F 1/463; B60L 11/1805; H02M 7/003; H02M 3/285; H02M 3/1584; H02M 3/3376
See application file for complete search history.

(56) References Cited

U.S. PATENT DOCUMENTS

| 2010/0259953 A1* | 10/2010 | Matthews | ......... H02M 3/33507 |
| | | | 363/20 |
| 2011/0103112 A1* | 5/2011 | Jiang | ................. H02M 3/33507 |
| | | | 363/125 |
| 2011/0140614 A1* | 6/2011 | Young | ................. H02M 1/4225 |
| | | | 315/185 R |

FOREIGN PATENT DOCUMENTS

| JP | 2013-246159 A | 12/2013 |
| KR | 10-1996-0035035 | 10/1996 |
| KR | 10-0211057 | 10/1996 |
| KR | 2009-0083125 | 8/2009 |
| WO | 2013/179868 A1 | 12/2013 |

* cited by examiner

*Primary Examiner* — Minh N Tang
(74) *Attorney, Agent, or Firm* — Mintz Levin Cohn Ferris Glovsky and Popeo, P.C.; Peter F. Corless

(57) ABSTRACT

A current sensing apparatus includes: a temperature sensor configured to sense a temperature of a power converter; a current sensing unit configured to sense an input current of the power converter; and a central processing unit (CPU) configured to control an operation of the power converter in response to the sensed temperature of the power converter and the sensed input current of the power converter. The CPU includes a compensation unit configured to store, upon receiving an indication of the sensed temperature of the power converter from the temperature sensor, an operation voltage of at least one diode included in the current sensing unit in a map, and to compensate for an error of a sensing current based on the stored operation voltage when the current sensing unit senses the input current.

5 Claims, 5 Drawing Sheets

CURRENT SENSING DEVICE AND METHOD USING CURRENT TRANSFORMER

CROSS-REFERENCE TO RELATED APPLICATION

This application claims priority to and the benefit of Korean patent application No. 10-2014-0147689 filed on Oct. 28, 2014, the disclosure of which is hereby incorporated in its entirety by reference.

TECHNICAL FIELD

Embodiments of the present disclosure relate to a current sensing device, and more particularly to a technology for enhancing the sensing accuracy of a current through temperature compensation when the current is sensed using a current transformer (CT).

BACKGROUND

It is generally known that vehicles with internal combustion engines can lead to environmental pollution or exhaustion of energy due to excessive consumption of energy. Thus, instead of using an internal combustion engine as a power source, vehicles using electricity as a power source (i.e., electric vehicles) and vehicles using a combination of an internal combustion engine and electricity (i.e., hybrid vehicles) have been developed and used.

In this regard, electric vehicles (EVs), hybrid electric vehicles (HEVs), fuel cell vehicles, and fuel-cell hybrid vehicles must drive using a motor with a voltage charged in a battery. Conventionally, a high-capacity charging battery has been widely used in electric vehicles, and a battery charging device for charging the high-capacity charging battery has also been embedded in the electric vehicles. Electric vehicles may include a low voltage DC-DC converter (LDC) configured to charge a battery of 12 volts (e.g., auxiliary battery), as well as to power on the entire load of the electric vehicle. The LDC can charge the 12V battery through conversion of high-voltage battery power.

The LDC operates in two modes, i.e., an operating mode and a charging mode. If the LDC operates in the operating mode, power of a main battery is supplied to the entire load of a power system so that the vehicle can operate with the battery power. If the LDC operates in the charging mode, an On-Board Charger (OBC) and a cooling fan are powered on so that it can control the charging process and can counteract excess heat emission. The OBC refers to a charging device embedded in a vehicle designed to use power as a power source. If the vehicle is charged with electricity through the OBC, an OBC control power-supply unit and a cooling fan are powered on, resulting in reduction of an output current of the LBC.

An input current sensor and an output current sensor may be simultaneously used to operate power conversion components such as the LDC or OBC, so that they can monitor input/output (I/O) signals. Recently, a method for estimating an output current using a value of the input current sensor without using the output current sensor has been widely used. As a result, although the cost and size of manufactured products are optimized, the output current sensor disappears, so that the sensing accuracy of the input current sensor becomes more significant.

Current transformers (CTs) are used to sense a current value of power conversion components installed in eco-friendly vehicles (e.g., electric vehicles, hybrid electric vehicles, etc.). In order to perform current sensing using a CT, a peripheral circuit including diodes, resistors, and capacitors are additionally needed.

An electronic component which is particularly sensitive to temperature from among a plurality of power electronic components used in the peripheral circuit is a diode. The higher the temperature, the lower the forward voltage (Vf), and the lower the temperature, the higher the forward voltage (Vf). As a result, an unexpected error may occur in the current sensing due to the diode. In order to reduce the current sensing error, there is a need to minimize the forward voltage (Vf) value of the diode affected by the temperature.

SUMMARY

Various embodiments of the present disclosure are directed to providing a current sensing device that substantially obviates one or more problems due to limitations and disadvantages of the related art.

Embodiments of the present disclosure relate to a current sensing device for enhancing the sensing accuracy of a current through temperature compensation when the current is sensed using a current transformer (CT).

In accordance with embodiments of the present disclosure, a current sensing apparatus includes: a temperature sensor configured to sense a temperature of a power converter; a current sensing unit configured to sense an input current of the power converter; and a central processing unit (CPU) configured to control an operation of the power converter in response to the sensed temperature of the power converter and the sensed input current of the power converter. The CPU includes: a compensation unit configured to store, upon receiving an indication of the sensed temperature of the power converter from the temperature sensor, an operation voltage of at least one diode included in the current sensing unit in a map, and to compensate for an error of a sensing current based on the stored operation voltage when the current sensing unit senses the input current of the power converter.

The current sensing unit may include a current transformer (CT).

The compensation unit may be further configured to establish a temperature of the at least one diode in response to the sensed temperature of the power converter, and the stored operation voltage corresponds to the temperature of the at least one diode in the map.

The operation voltage of the at least one diode may include a forward voltage value of the at least one diode.

The current sensing unit may include: a CT configured to sense the input current of the power converter; a rectifier configured to rectify an output signal of the CT; a comparator configured to compare an output signal of the rectifier to a feedback signal of a first node, and to output a result of the comparison to the first node; and a filter unit configured to filter a signal of the first node.

The rectifier may include the at least one diode.

The comparator may include the at least one diode.

Furthermore, in accordance with embodiments of the present disclosure includes: sensing, by a temperature sensor, a temperature of a power converter; sensing, by a current sensing unit, an input current of the power converter; controlling, by a CPU, an operation of the power converter in response to the sensed temperature of the power converter and the sensed input current of the power converter; storing, by the CPU, an operation voltage of at least one diode included in the current sensing unit in a map, upon receiving an indication of the sensed temperature of the power converter from the temperature sensor; and compensating, by the CPU, for an error of a sensing current based on the stored operation voltage when the current sensing unit senses the input current of the power converter.

Furthermore, in accordance with embodiments of the present disclosure, a non-transitory computer readable medium containing program instructions for performing a current sensing method includes: program instructions that control an operation of a power converter in response to a temperature of the power converter sensed by a temperature sensor and an input current of the power converter sensed by a current sensing unit; program instructions that store an operation voltage of at least one diode included in the current sensing unit in a map, upon receiving an indication of the sensed temperature of the power converter from the temperature sensor; and program instructions that compensate for an error of a sensing current based on the stored operation voltage when the current sensing unit senses the input current of the power converter.

It is to be understood that both the foregoing general description and the following detailed description of the present disclosure are exemplary and explanatory and are intended to provide further explanation of the embodiments as claimed.

DETAILED DESCRIPTION OF EMBODIMENTS

Reference will now be made in detail to the embodiments of the present disclosure, examples of which are illustrated in the accompanying drawings. Wherever possible, the same reference numbers will be used throughout the drawings to refer to the same or like parts.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one central processing unit (CPU). The term "CPU" may refer to a hardware device that includes a processor, which may be directly or indirectly coupled to a memory. The memory is configured to store program instructions, and the processor is configured to execute the program instructions to perform one or more processes which are described further below. Moreover, it is understood that the below methods may be executed by an apparatus comprising the CPU.

Furthermore, the CPU of the present disclosure may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Figure 1:
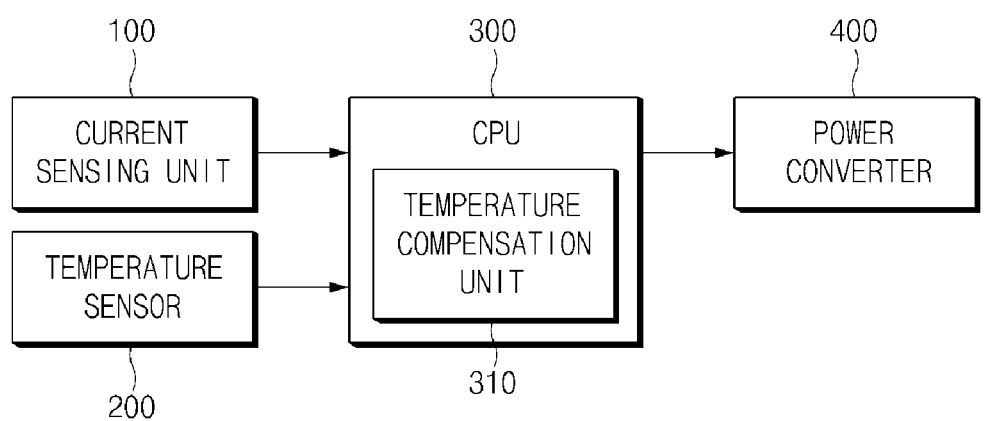
FIG. 1 is a block diagram illustrating a current sensing device according to embodiments of the present disclosure.

FIG. 1 is a block diagram illustrating a current sensing device according to embodiments of the present disclosure.

Referring to FIG. 1, the current sensing device includes a current sensing unit 100, a temperature sensor 200, a CPU 300, and a power converter 400. In this case, the CPU 300 may include a temperature compensation unit 310 (alternatively referred to as a "compensation unit").

The current sensing unit 100 may include a current transformer (CT) to sense a current of the power converter 400. The current sensing unit 100 may sense the current through the CT, and may output the sensed current to the CPU 300 through a peripheral circuit including a diode, a resistor, a capacitor, etc.

The temperature sensor 200 may sense the temperature of the power converter 400 and output the sensed temperature to the CPU 300. Although the temperature sensor 200 and the power converter 400 shown in FIG. 1 are separated from each other for convenience of description, the scope or spirit of the present disclosure is not limited thereto, and the temperature 200 can also be embedded in the power converter 400.

The CPU 300 may control driving of the power converter 400 in response to the sensing result of the current sensing unit 100 and the temperature sensor 200. The CPU may drive the power converter 400 using a predetermined algorithm. For this purpose, the CPU 300 may include the temperature compensation unit 310. In this case, the CPU 300 may be placed on a control board.

The temperature compensation unit 310 may manage a diode temperature using a map in response to the temperature value detected by the temperature sensor 200, so that the current sensing error changing with a temperature can be minimized. That is, the temperature compensation unit 310 may prepare a mapping table for the diode operation voltage contained in the current sensing unit 1100. The temperature compensation unit 310 may convert a current value of the current sensing unit 100 into a substantial current value in response a temperature sensed by the temperature sensor 200 using the mapping table.

The power converter 400 may include a Low Voltage DC-DC Converter (LDC) and an On Board Charger (OBC). A power-supply voltage is converted after passing through a high-voltage battery and the LDC, an auxiliary battery is charged with the converted voltage, so that electronic components of a vehicle can be powered on. The OBC is a charging module embedded in the vehicle, and is used to fully charge the battery through a plug. It should be understood that although the power converter 400 is described above as including the LDC and the OBC, the present disclosure is not limited thereto (e.g., the power converter 400 need not be configured in the above manner), and the present embodiments may further include other power converters.

Figure 2:
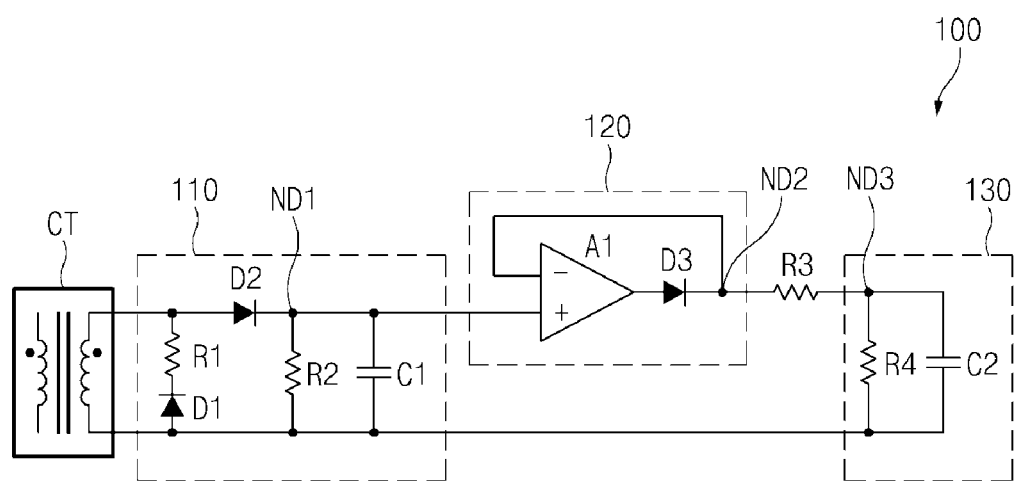
FIG. 2 is a detailed circuit diagram illustrating a current sensing unit shown in FIG. 1.

FIG. 2 is a detailed circuit diagram illustrating the current sensing unit 100 shown in FIG. 1. The current sensing unit 100 includes a current transformer (CT), a rectifier 110, a comparator 120, and a filtering unit 130. In this case, the CT may sense the input current value applied to an input terminal of the power converter 400.

The rectifier 110 may include a plurality of resistors (R1, R2), a plurality of diodes (D1, D2), and a capacitor C1. The diode D1 is coupled in a forward direction between the CT and the resistor R1. The resistor R2 is coupled in series to the diode D1. The diode D2 is coupled in a forward direction between the CT and a node ND1. For example, the resistor R2 and the capacitor C2 are coupled in parallel to the node ND1.

The comparator 120 includes a comparator A1 and a diode D3. In this case, the comparator A1 may compare an output signal of the node ND1 with an output signal of a node ND2, and output the comparison result to the node ND2. A negative(−) terminal of the comparator A1 is coupled to the node ND2, and a positive(+) terminal of the comparator A1 is coupled to the node ND1. The diode D3 is coupled in a forward direction between the output terminal of the comparator A1 and the node ND2.

In addition, the filtering unit 130 may include a plurality of resistors (R3, R4) and a capacitor C2. Here, the resistor R2 is coupled between the node ND2 and a node ND3. The resistor R4 and the capacitor C2 are coupled in parallel to the node ND3.

Figure 3:
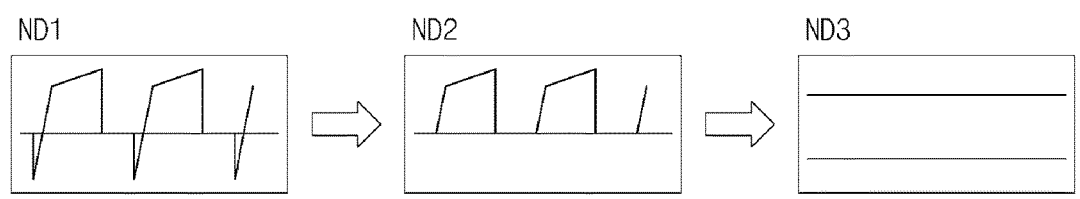
FIG. 3 is a waveform diagram illustrating the operations of a current sensing unit shown in FIG. 2.

FIG. 3 is a waveform diagram of an input current flowing in the current sensing unit 100. A current sensed by the CT may be applied to the node ND1 through the diodes (D1, D2), the resistors (R1, R2) and the node ND1. In FIG. 3, a first waveform diagram is a waveform of the input current flowing in the node ND1.

Thereafter, the comparator A1 compares the output signal of the node ND1 with a feedback input signal from the node ND2, and outputs the comparison result to the diode D3. A signal output to the comparator A1 is rectified through the diode D3, so that the rectified signal is output to the node ND2. In this case, a second waveform diagram of FIG. 3 shows a waveform of the current flowing in the node ND2. Thereafter, the output current of the node ND2 is filtered through the resistors (R3, R4) and the capacitor C2. The current of the node ND3 of the filtering unit 130 is output as a DC voltage value.

For example, diodes D1~D3 for use in the current sensing unit 100 are characterized in that the operation voltage (forward voltage: Vf) of each diode is gradually reduced in proportion to an increasing temperature, and is gradually increased in proportion to a decreasing temperature. For example, under a specific condition of a temperature 25° C., the forward voltage (Vf) of each diode is set to 1V and the sensing current of the CT has a waveform shown in FIG. 4. Under a condition of a temperature 125° C., the forward voltage (Vf) of each diode is set to 0.8V and the sensing current of the CT has a waveform shown in FIG. 5.

Although the same condition is given, the forward voltage (Vf) changes with temperature so that unexpected errors may occur in the current sensing operation. In this case, not only the accuracy of the sensing operation of the input current but also the accuracy of the sensing operation of the output current is deteriorated. Accordingly, assuming that a logic that is capable of compensating for the diode forward voltage (Vf) in response to a temperature using the temperature compensation unit 310 is applied to the embodiments of the present disclosure, the sensing error of the input current can be minimized.

Figure 4:
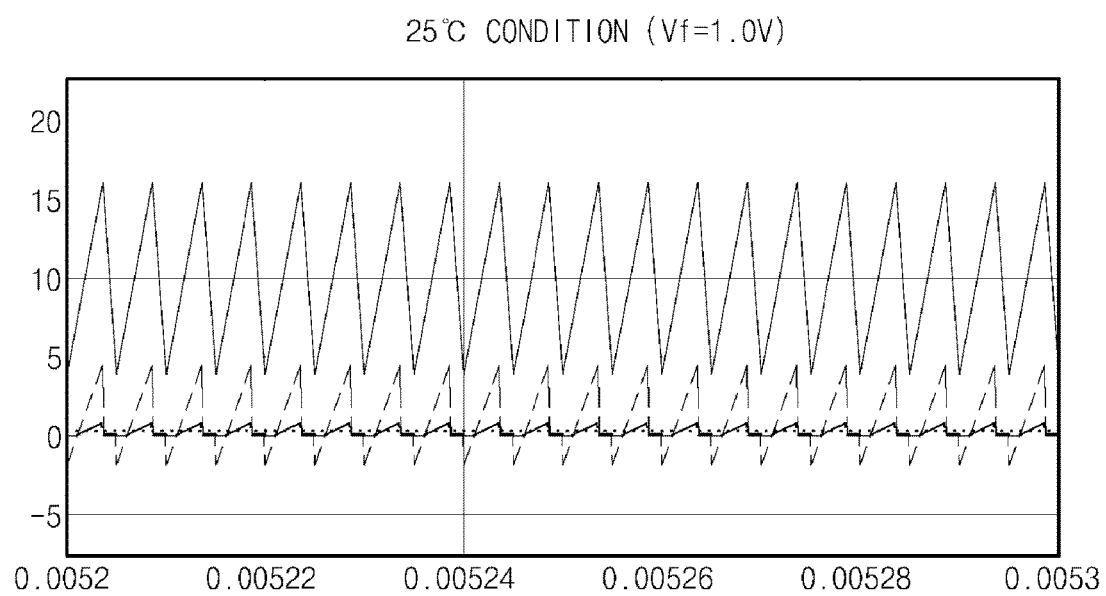
FIGS. 4 and 5 are graphs illustrating the effect of the current sensing device according to embodiments of the present disclosure.
Figure 5:
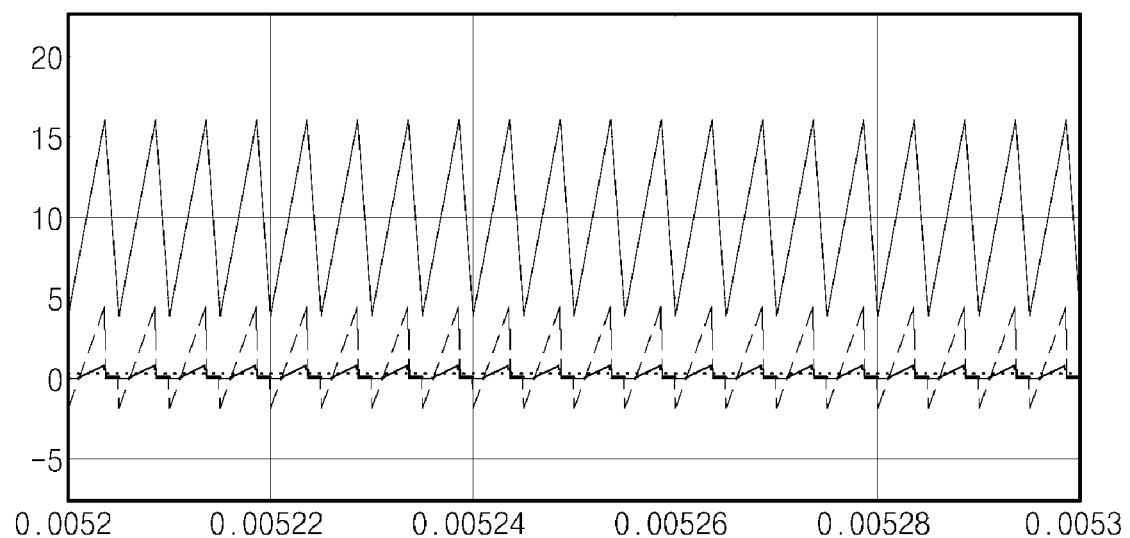

Referring to the graphs of FIGS. 4 and 5, the sensing current may have a degree of error of about 5% in response to the diode forward voltage (Vf) changing with temperature. Therefore, the temperature compensation unit 310 may predict the diode forward voltage (Vf) changing with temperature, and then store the predicted forward voltage (Vf) in a map. The temperature compensation unit 310 may experimentally predict the sensing current error generated by different forward voltages (Vf). Accordingly, the temperature compensation unit 310 may compensate for the sensing current error using the following temperature compensation map shown in Table 1.

TABLE 1

| Temperature sensor | Diode temperature | Forward voltage (Vf) |
|---|---|---|
| 25° C. | 50° C. | 0.95 |
| 80° C. | 105° C. | 0.85 |
| 125° C. | 150° C. | 0.75 |

Referring to Table 1, if the temperature sensor 200 has a temperature of 25° C., the diode of the current sensing unit 100 has a temperature of 50° C., and the diode forward voltage (Vf) is set to 0.95. If the temperature sensor 200 has a temperature of 80° C., the diode of the current sensing unit 100 has a temperature of 105° C., and the diode forward voltage (Vf) is set to 0.85. In addition, if the temperature sensor 200 has a temperature of 125° C., the diode of the current sensing unit 100 is set to 150° C., and the diode forward voltage (Vf) is set to 0.75.

The temperature sensor 200 for protecting overheating of power elements is embedded in the power converter 400. The CPU 300 may perform a normal operation command and an output limitation command of the power converter 400 in response to a temperature value detected by the temperature sensor 200.

In this instance, the CPU 300 has already recognized peripheral temperatures through the temperature sensor 200. Therefore, the temperature compensation unit 310 may configure respective diode temperatures of the current sensing unit 100 in the form of a map on the basis of the temperature values detected by the temperature sensor 200, and manage the map-shaped diode temperatures, so that the sensing current error changing with temperature can be minimized.

Although the current sensing operation aims to monitor a current value, the current sensing operation may have an overcurrent protection function to protect the power converter 400 from an abnormal condition. Under the condition that a maximum current of each component is 20 amperes (A), if the maximum current of 20 A of the component is wrongly recognized as a lower current of 19 A due to the temperature sensing error and an actual current of 21 A flows in the component, there is a high possibility of damaging the component. As a result, since the current sensing accuracy increases, the overcurrent protection function can be carried out.

In addition, the actual products have been designed to have a considerably large margin in consideration of the sensing error. For example, if the sensing accuracy increases, the products can be designed to have an optimum margin, so that the size and cost of each product can be reduced.

It should be understood that the above-mentioned embodiments have been disclosed only for illustrative purposes, and are not limited thereto. For example, a single-type constituent element may be embodied in a distributed manner, and distributed-type constituent elements may also be combined into one element.

As is apparent from the above description, the embodiments of the present disclosure have at least the following effects. First, for example, the current sensing device compensates for a variation of the diode's forward voltage changing with a temperature using a temperature compensation logic to which a temperature compensation map is reflected, resulting in increased sensing accuracy. Second, for example, when the I/O currents are monitored by the input current sensor, the sensing accuracy of the input current is increased, so that the monitoring quality of the output current can be improved. Third, for example, the current sensing device according to the embodiments can strengthen the I/O overcurrent protection function.

The embodiments of the present disclosure have been disclosed herein merely for illustrative purposes, and those skilled in the art will appreciate that various modifications, additions and substitutions are possible, without departing from the scope and spirit of the disclosure as disclosed in the accompanying claims.

What is claimed is:

1. A current sensing apparatus comprising:
   a temperature sensor configured to sense a temperature of a power converter, thereby generating a sensed temperature;
   a current sensing unit configured to sense an input current of the power converter, thereby generating a sensed input current; and
   a central processing unit (CPU) configured to control an operation of the power converter in response to the sensed temperature of the power converter and the sensed input current of the power converter,
   wherein the CPU includes:
   a compensation unit configured to store, upon receiving an indication of the sensed temperature of the power converter from the temperature sensor, an operation voltage of at least one diode included in the current sensing unit in a map, and to compensate for an error of the sensed input current based on the stored operation voltage when the current sensing unit senses the input current of the power converter, and
   wherein the current sensing unit includes:
   a current transformer configured to sense the input current of the power converter;
   a rectifier configured to rectify an output signal of the current transformer;
   a comparator configured to compare an output signal of the rectifier to a feedback signal of a first node, and to output a result of the comparison to the first node; and
   a filter unit configured to filter a signal of the first node.

2. The apparatus according to claim 1, wherein the compensation unit is further configured to establish a temperature of the at least one diode in response to the sensed temperature of the power converter, and the stored operation voltage corresponds to the temperature of the at least one diode in the map.

3. The apparatus according to claim 1, wherein the operation voltage of the at least one diode includes a forward voltage value of the at least one diode.

4. The apparatus according to claim 1, wherein the rectifier includes the at least one diode.

5. The apparatus according to claim 1, wherein the comparator includes the at least one diode.

* * * * *